United States Patent
Tokuyama et al.

(10) Patent No.: US 8,415,707 B2
(45) Date of Patent: Apr. 9, 2013

(54) GROUP III NITRIDE SEMICONDUCTOR DEVICE

(75) Inventors: Shinji Tokuyama, Osaka (JP); Masaki Ueno, Itami (JP); Masahiro Adachi, Osaka (JP); Takashi Kyono, Itami (JP); Takamichi Sumitomo, Itami (JP); Koji Katayama, Osaka (JP); Yoshihiro Saito, Yokohama (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 39 days.

(21) Appl. No.: 12/834,977

(22) Filed: Jul. 13, 2010

(65) Prior Publication Data

US 2011/0175201 A1  Jul. 21, 2011

(30) Foreign Application Priority Data

Jan. 18, 2010  (JP) ................ P2010-008232

(51) Int. Cl.
*H01L 33/00* (2010.01)
(52) U.S. Cl. .......... 257/103; 257/99; 257/E33.023; 257/E33.003; 238/22; 238/46
(58) Field of Classification Search .......... 257/99, 257/103, 79, E33.003, E33.023; 438/22, 438/46
See application file for complete search history.

(56) References Cited

U.S. PATENT DOCUMENTS

| 6,165,812 A * | 12/2000 | Ishibashi et al. ........... 438/46 |
| 6,946,372 B2 * | 9/2005 | Kim ...................... 438/487 |
| 7,858,996 B2 * | 12/2010 | Zhong et al. ............... 257/98 |
| 2006/0270200 A1 * | 11/2006 | Shibata .................. 438/481 |
| 2007/0164292 A1 * | 7/2007 | Okuyama ................. 257/79 |
| 2009/0127539 A1 * | 5/2009 | Shakuda .................. 257/13 |
| 2009/0170304 A1 * | 7/2009 | Tarui et al. ............... 438/608 |
| 2010/0055820 A1 * | 3/2010 | Akita et al. ............... 438/47 |
| 2010/0200865 A1 * | 8/2010 | Fujito et al. .............. 257/76 |
| 2010/0260224 A1 * | 10/2010 | Yoshizumi et al. ....... 372/45.01 |

FOREIGN PATENT DOCUMENTS

| JP | 5-291621 | 11/1993 |
| JP | 9-64337 | 3/1997 |
| JP | 11-186605 | 7/1999 |
| JP | 2004-247323 | 9/2004 |

(Continued)

OTHER PUBLICATIONS

Narihito Okada, Akihiro Kurisu, Kazuma Murakami and Kazuyuki Tadatomo; Growth of Semipolar ($11\bar{2}2$) GaN Layer by Controlling Anisotropic Growth Rates in R-Plane Patterned Sapphire Substrate; Appl. Phys. Express 2 (2009) 091001.*

(Continued)

*Primary Examiner* — Jarrett Stark
(74) *Attorney, Agent, or Firm* — Drinker Biddle & Reath LLP

(57) ABSTRACT

A Group III nitride semiconductor device has a semiconductor region, a metal electrode, and a transition layer. The semiconductor region has a surface comprised of a Group III nitride crystal. The semiconductor region is doped with a p-type dopant. The surface is one of a semipolar surface and a nonpolar surface. The metal electrode is provided on the surface. The transition layer is formed between the Group III nitride crystal of the semiconductor region and the metal electrode. The transition layer is made by interdiffusion of a metal of the metal electrode and a Group III nitride of the semiconductor region.

3 Claims, 11 Drawing Sheets

FOREIGN PATENT DOCUMENTS

| | | |
|---|---|---|
| JP | 2005277403 A | 10/2005 |
| JP | 2006013474 A | 1/2006 |
| JP | 2008543089 T | 11/2008 |
| JP | 2009231609 A | 10/2009 |
| KR | 10-2009-0091019 | 8/2009 |

OTHER PUBLICATIONS

Nezu, "The green semiconductor laser finally oscillates. Sumitomo Electric Industries, Ltd. succeeded in the pulsed oscillation," NIKKEI Electronics, Nikkei BP, Aug. 24, 2009, p. 15 including English translation.

"Issue of Nikkan Kogyo Shimbun," Nikkan Kogyo Shimbun Ltd., Business and Technology, Aug. 20, 2009, p. 9 including English translation.

Yohei Enya et al., "531 nm Green Lasing of InGaN Based Laser Diodes on Semi-Polar {2021} Free-Standing GaN Substrates," Applied Physics Express, The Japan Society of Applied Physics, Jul. 17, 2009, vol. 2, No. 8, pp. 082101-1-082101-3.

Yusuke Yoshizumi et al., "Continuous-Wave Operation of 520 nm Green InGaN-Based Laser Diodes on Semi-Polar {2021} GaN Substrates," Applied Physics Express, The Japan Society of Applied Physics, Aug. 21, 2009, vol. 2, No. 9, pp. 092101-1-092101-3.

Takashi Kyono et al., "Optical Polarization Characteristics of InGaN Quantum Wells for Green Laser Diodes on Semi-Polar {2021} GaN Substrates," Applied Physics Express, The Japan Society of Applied Physics, Jan. 8, 2010, vol. 3, No. 1, pp. 011003-1-011003-3.

Office Action from counterpart Korean patent application No. 10-2011-7010827 dated Aug. 16, 2012 and its English translation thereof (8 pages).

* cited by examiner

Fig.2
(a)
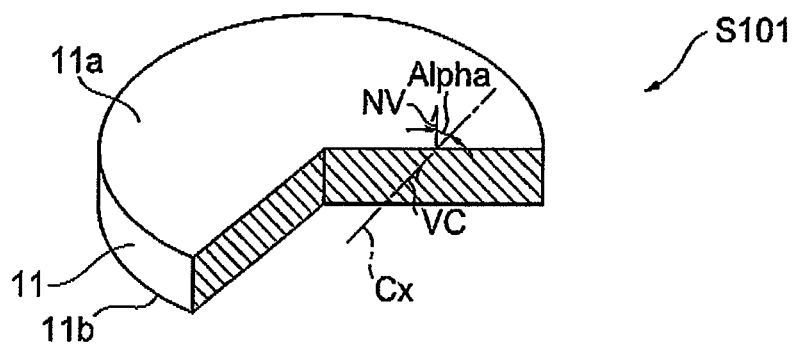
(b)
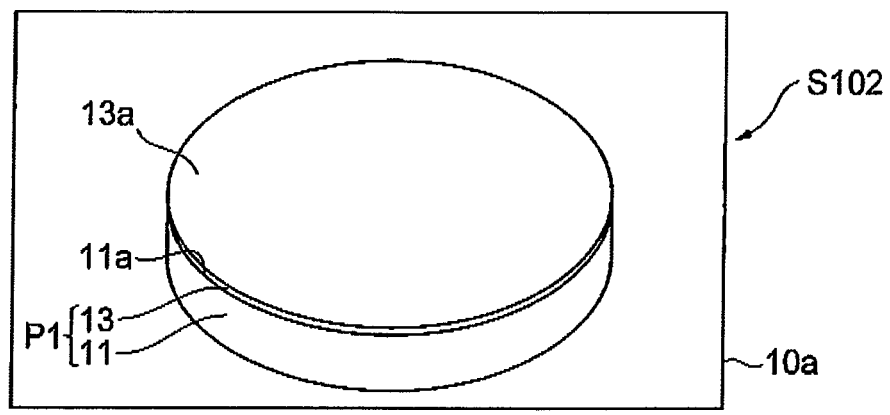
(c)
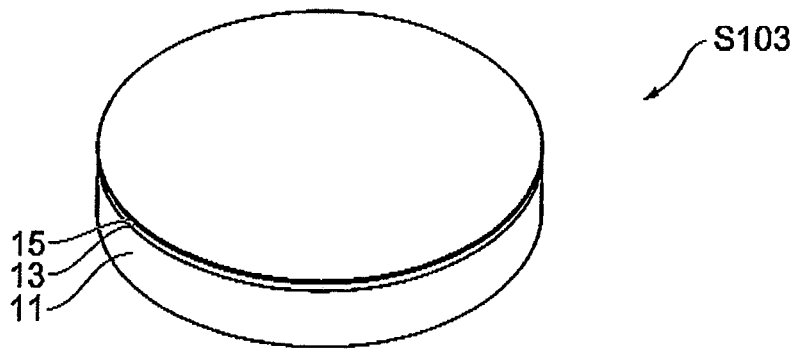

Fig.3
(a)
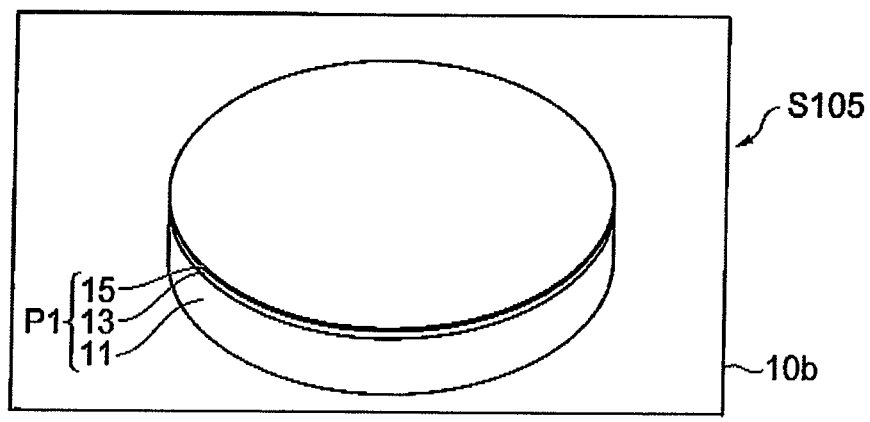
(b)
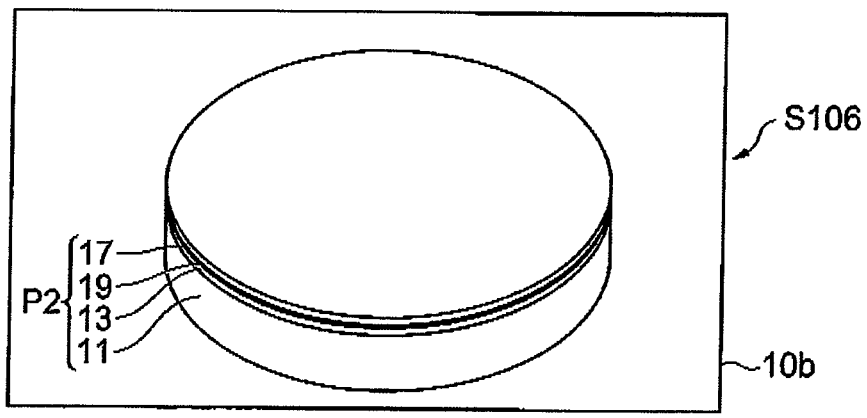

*Fig.6*
(a)
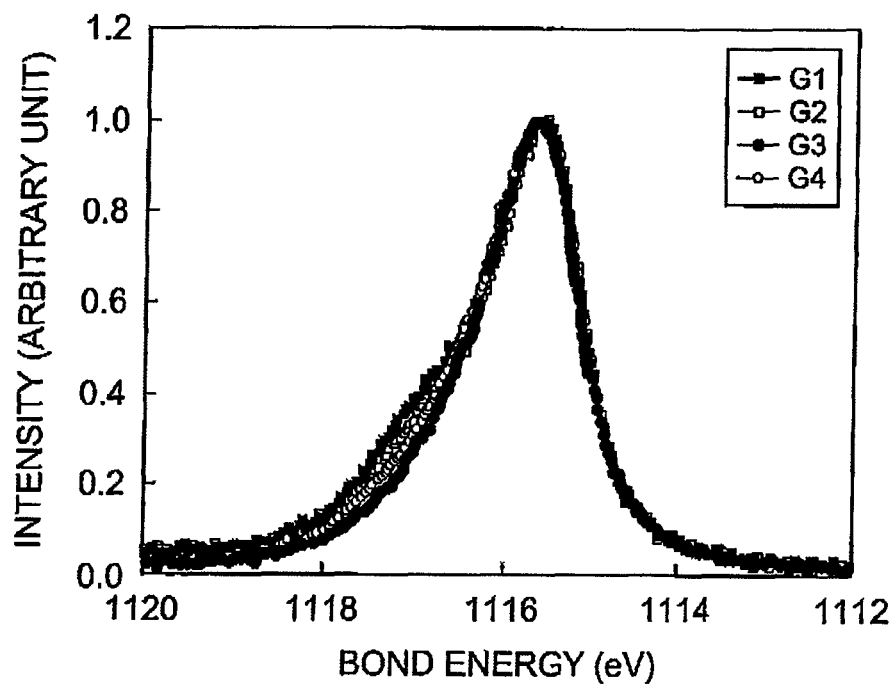
(b)
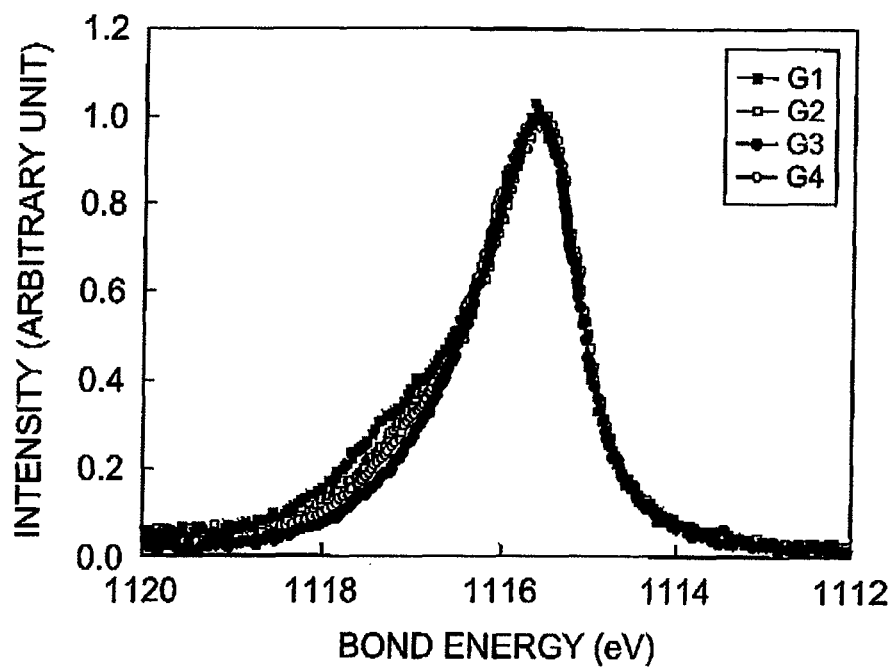

Fig.7
(a)
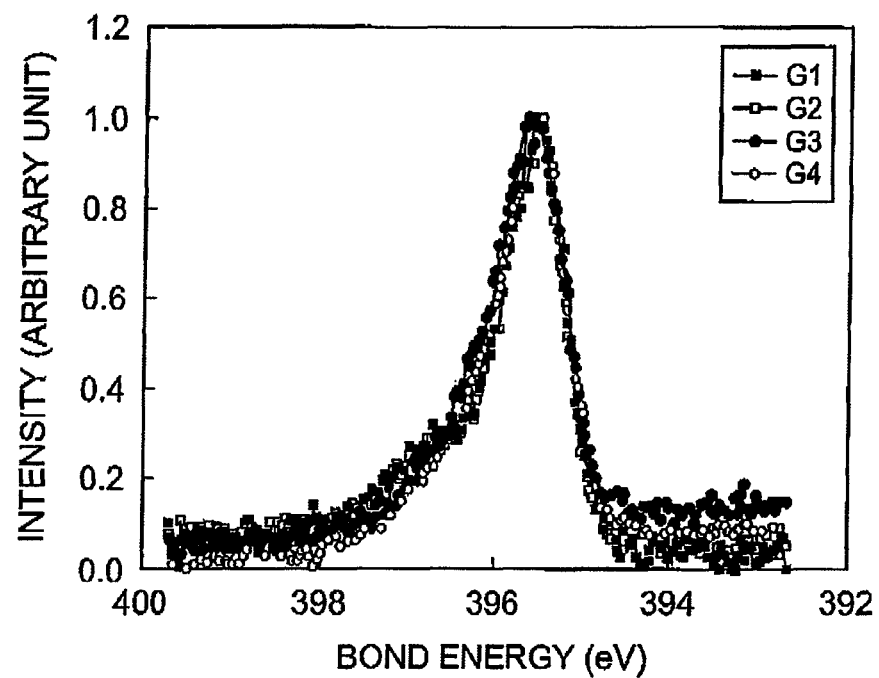
(b)
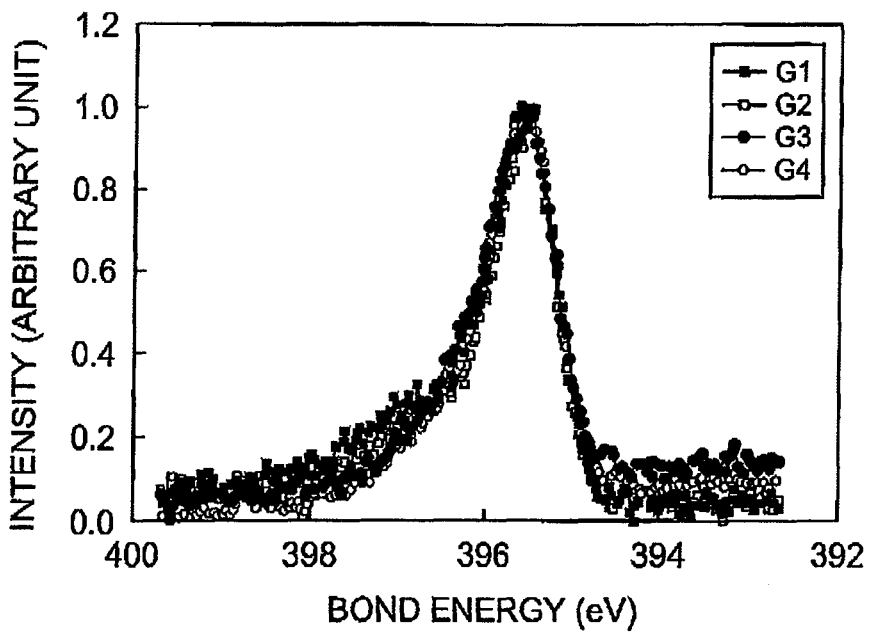

Fig. 9
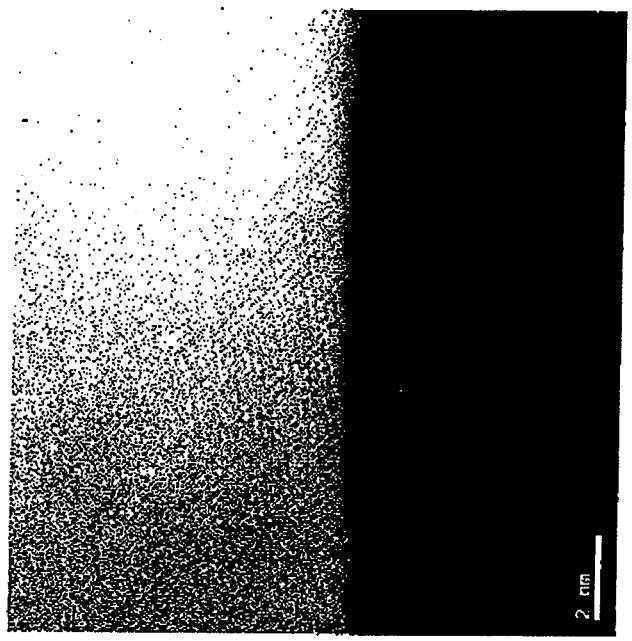
(b)
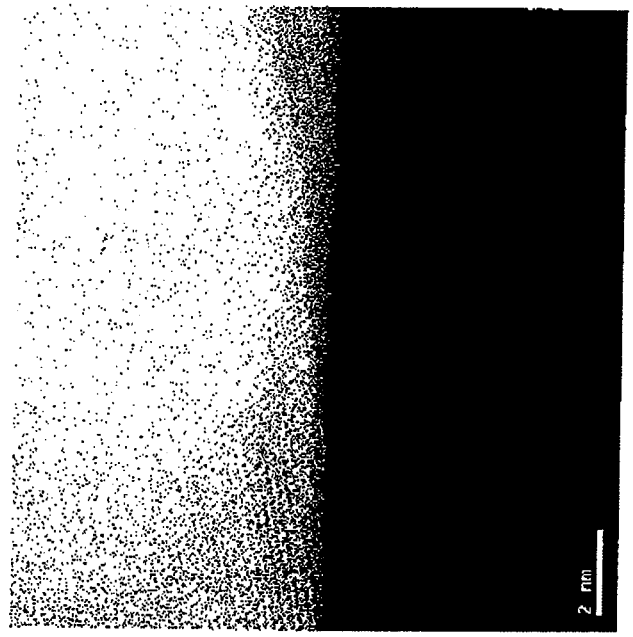
(a)

Fig.10
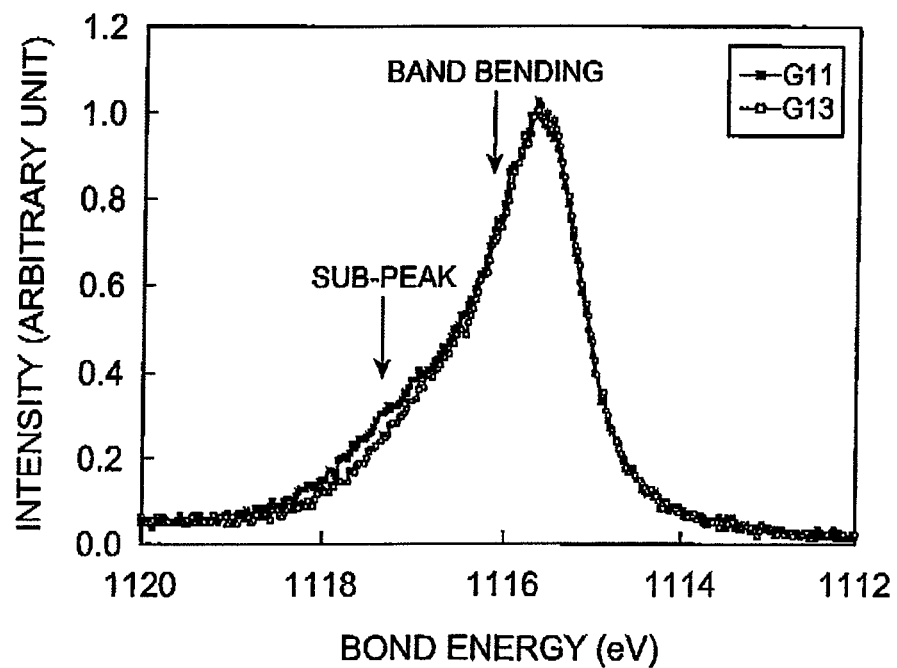
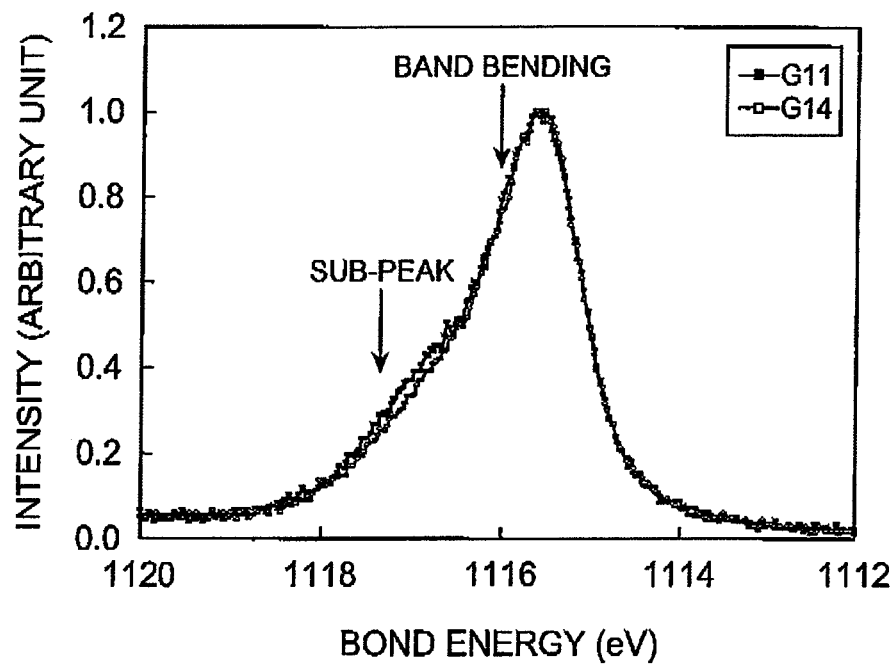

Fig. 11
(a)
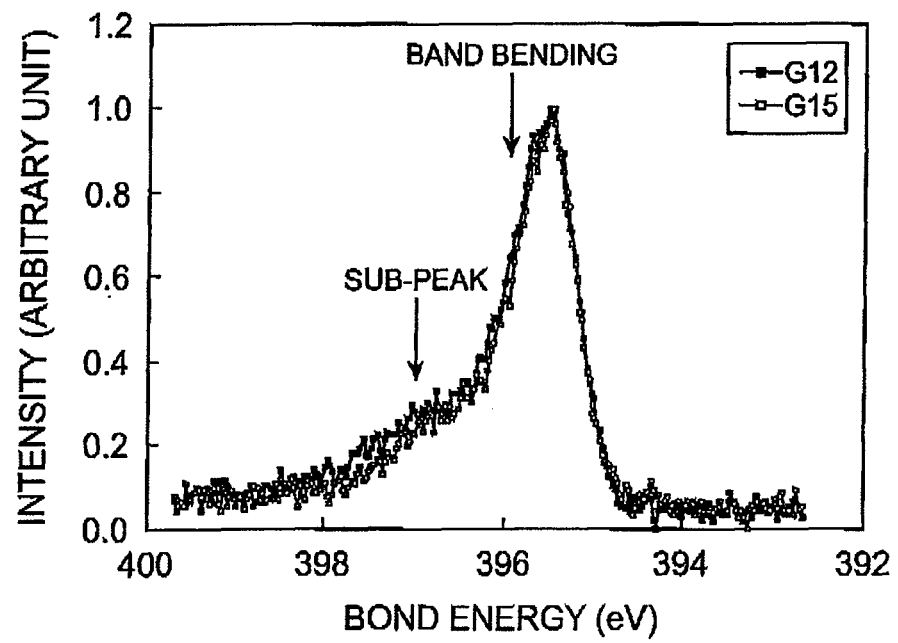
(b)
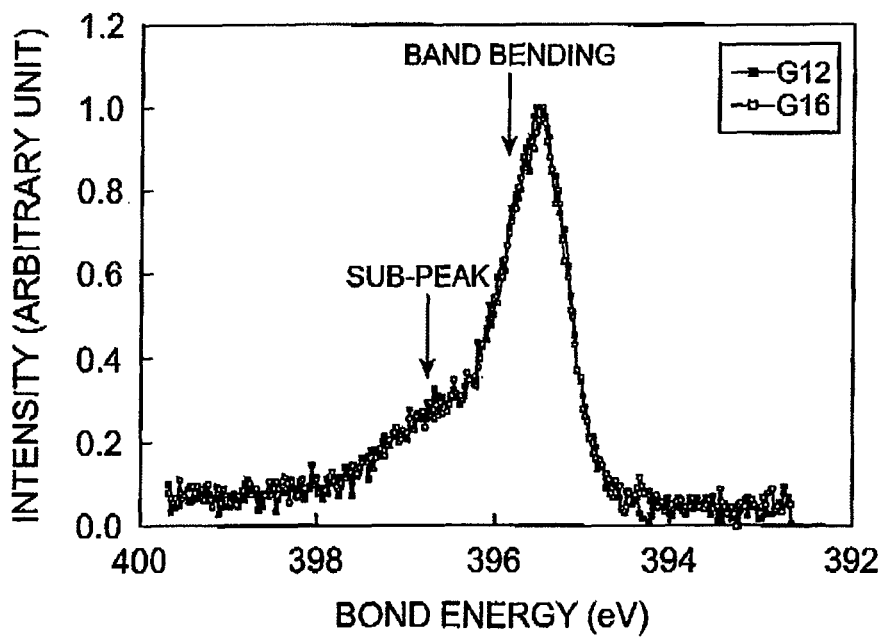

GROUP III NITRIDE SEMICONDUCTOR DEVICE

BACKGROUND OF THE INVENTION

1. Field of the Invention

The present invention relates to a Group III nitride semiconductor device.

2. Related Background Art

Patent Literatures 1 and 2 describe a method for forming an ohmic electrode on a p-type gallium nitride (GaN) layer grown on a (0001) plane or c-plane. In this method, Ni/Au film is evaporated onto the p-type GaN layer and thereafter a thermal treatment is carried out in an oxygen atmosphere. An oxide film exists on the surface of the p-type GaN layer, but nickel absorbs the oxide film by this method. Then nickel binds to oxygen atoms of the oxide film, thereby removing the oxide film. This allows gold to come into contact with the p-type GaN crystal, thereby forming an ohmic contact.

Patent Literature 3 describes the result of an experiment. In this experiment, a p-type Group III nitride semiconductor layer is grown on a sapphire substrate. Then the substrate is heated to 300° C. and thereafter platinum or nickel is evaporated onto a surface of the Group III nitride semiconductor layer. Thereafter, the contact resistance is measured.

In the method described in Patent Literature 4, platinum is evaporated onto a p-type GaN contact layer. Then a thermal treatment is carried out in the range of 500° C. to 600° C. in an oxygen atmosphere to form an alloy electrode.

Patent Literature 1: Japanese Unexamined Patent Application Publication No. 5-291621
Patent Literature 2: Japanese Unexamined Patent Application Publication No. 9-64337
Patent Literature 3: Japanese Unexamined Patent Application Publication No. 2004-247323
Patent Literature 4: Japanese Unexamined Patent Application Publication No. 11-186605

SUMMARY OF THE INVENTION

In production of Group III nitride-based semiconductor light emitting devices, depending upon the emission wavelength required, there are cases where a Group III nitride semiconductor containing indium, e.g., InGaN or InAlGaN, is grown on a Group III nitride semiconductor substrate, e.g., a GaN substrate. Since the diameter of indium atom is larger than the diameter of gallium atom, increase in the indium composition leads to increase in internal strain in the indium-containing layer because of lattice mismatch. As a result, a large piezoelectric field is induced in the layer, so as to decrease the recombination probability and thus reduce the luminous efficiency.

A technology to solve this problem is to grow the indium-containing Group III nitride semiconductor on a plane largely inclined from the c-plane of the Group III nitride semiconductor crystal. The reason is that the piezoelectric field in the layer can be reduced by growing the indium-containing Group III nitride semiconductor on the plane largely inclined from the c-plane.

In the case of the conventional ohmic electrodes described above, the contact resistance decreases when the electrode is formed on the primary surface of Group III nitride semiconductor parallel to the c-plane. However, the contact resistance increases when the electrode is formed on the primary surface of the Group III nitride semiconductor largely inclined from the c-plane. It is because a thick surface oxide film is formed when the primary surface of the Group III nitride semiconductor is largely inclined from the c-plane.

In an aspect of the present invention, a group III nitride semiconductor device comprises (1) a semiconductor region having a surface comprised of a Group III nitride crystal, the semiconductor region being doped with a p-type dopant, the surface being one of a semipolar surface and a nonpolar surface, (2) a metal electrode provided on the surface, and (3) a transition layer formed between the Group III nitride crystal of the semiconductor region and the metal electrode, the transition layer being made by interdiffusion of a metal of the metal electrode and a Group III nitride of the semiconductor region.

A thickness of the transition layer may be more than or equal to 0.5 nm, and less than or equal to 3 nm.

The metal electrode may contain at least one of palladium and platinum.

The metal electrode may be completed without a thermal treatment process after forming a metal film on the surface.

An angle between a normal to the surface and a c-axis of the Group III nitride crystal constituting the semiconductor region may be in the range of 10 degrees to 80 degrees.

An angle between a normal to the surface and a c-axis of the Group III nitride crystal constituting the semiconductor region may be in the range of 100 degrees to 170 degrees.

An angle between a normal to the surface and a c-axis of the Group III nitride crystal constituting the semiconductor region may be in the range of 63 degrees to 80 degrees.

An angle between a normal to the surface and a c-axis of the Group III nitride crystal constituting the semiconductor region may be in the range of 100 degrees to 117 degrees.

The above object and other objects, features, and advantages of the present invention will more readily become apparent in view of the following detailed description of the preferred embodiments of the present invention proceeding with reference to the accompanying drawings.

BRIEF DESCRIPTION OF THE DRAWINGS

FIG. 2 is a drawing schematically showing products in the major steps shown in FIG. 1.

FIG. 3 is a drawing schematically showing products in the major steps shown in FIG. 1.

FIG. 6 is a graph showing the results of analysis of epitaxial substrates in Example 2.

FIG. 7 is a graph showing the results of analysis of epitaxial substrates in Example 2.

FIG. 9 is a photograph of cross sections of the epitaxial substrates produced in Example 2. The photograph is taken with a transmission electron microscope.

FIG. 10 is a graph showing the difference of spectra depending upon the presence of a surface treatment process, in epitaxial substrates with palladium electrodes thereon.

FIG. 11 is a graph showing the difference of spectra depending upon the presence of a surface treatment process, in epitaxial substrates with palladium electrodes thereon.

DETAILED DESCRIPTION OF THE PREFERRED EMBODIMENTS

Figure 1:
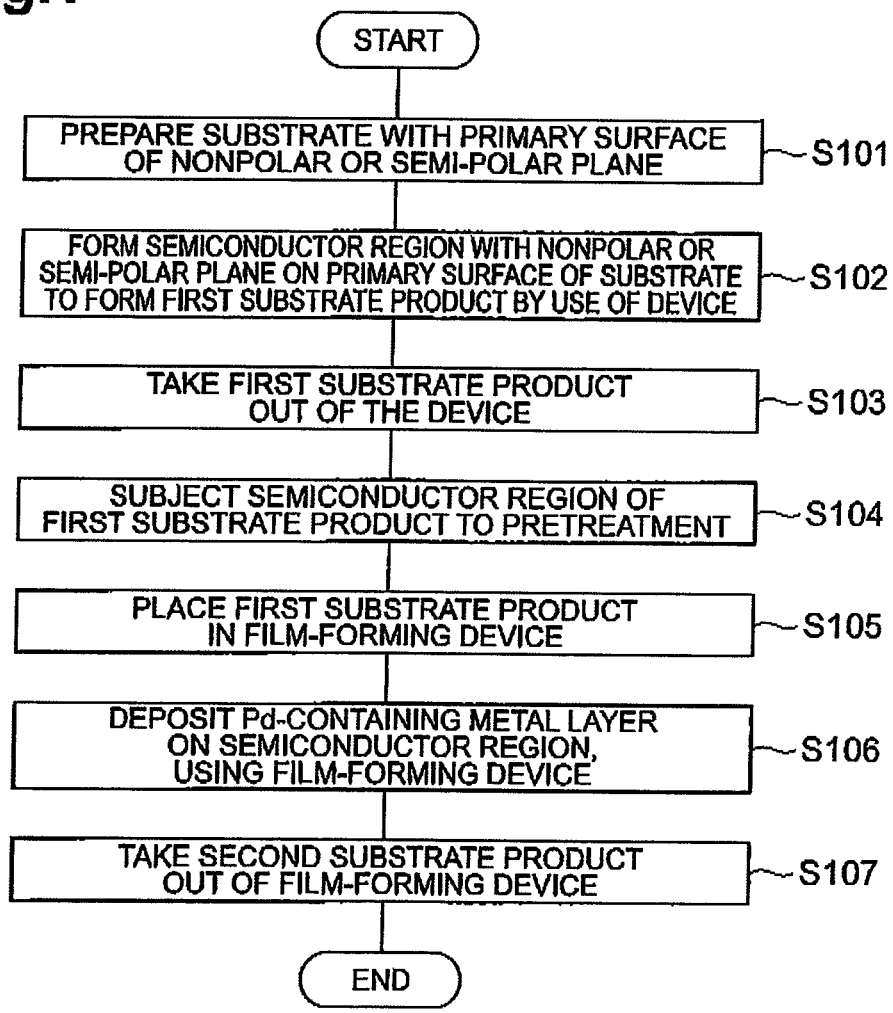
FIG. 1 is a drawing showing major steps in a method for fabricating a Group III nitride semiconductor device according to an embodiment.

Embodiments of the Group III nitride semiconductor device according to the present invention will be described below in detail with reference to the accompanying drawings of FIGS. 1 to 11. In the description of the drawings the same elements will be denoted by the same reference numerals, without redundant description.

FIG. 1 is a drawing showing major steps in a method for fabricating a Group III nitride semiconductor device according to an embodiment. FIGS. 2 and 3 are drawings schematically showing products in the major steps shown in FIG. 1. The Group III nitride semiconductor device is an optical device, for example, such as a laser diode and a light emitting diode, or an electronic device, for example, such as a pn junction diode and a transistor.

Step S101 in FIG. 1 is to prepare a substrate 11 shown in Part (a) of FIG. 2. In a preferred embodiment, the substrate 11 has a nonpolar or semipolar primary surface. The substrate 11 is comprised, for example, of Group III nitride semiconductor of the wurtzite structure. Examples of such Group III nitride semiconductors include AlN, gallium nitride-based semiconductors such as AlGaN and GaN, and so on. With use of these GaN-based semiconductors, the primary surface 11a of the substrate 11 has nonpolar or semipolar nature. The axis Cx shown in Part (a) of FIG. 2 indicates a direction of the c-axis (<0001> axis) of the Group III nitride semiconductor of the substrate 11, and the direction of the axis Cx is represented by a c-axis vector VC. A normal vector NV is normal to the primary surface 11a of the substrate 11. An angle Alpha between the normal vector NV on the substrate 11 and the c-axis vector VC is, for example, in the range of not less than 10 degrees and not more than 170 degrees.

In step S102, the substrate 11 is placed in a processing device 10a such as a growth furnace, as shown in Part (b) of FIG. 2. Thereafter, a semiconductor region 13 is grown on the primary surface 11a of the substrate 11. The semiconductor region 13 is comprised of Group III nitride crystal. The semiconductor region 13 preferably includes, for example, a GaN-based semiconductor layer or a plurality of GaN-based semiconductor layers. In the present embodiment, the semiconductor region 13 is provided by epitaxial growth on the primary surface 11a of the substrate 11. This crystal growth is carried out, for example, by organometallic vapor phase epitaxy or by molecular beam epitaxy. A top surface 13a of the semiconductor region 13 has nonpolar or semipolar nature. The surface 13a of the semiconductor region 13 is comprised of p-type Group III nitride semiconductor, e.g., GaN-based semiconductor. The p-type Group III nitride semiconductor is doped with a high concentration of a p-type dopant, e.g., Mg. It should be noted that the formation of the p-type Group III nitride semiconductor is not limited only to the epitaxial growth. These steps result in producing a first substrate product P1.

Step S103 is to take the first substrate product P1 out of the processing device 10a. At this time, the surface 13a of the semiconductor region 13 exposed to the atmosphere is more likely to be oxidized than a polar surface as the c-plane. Namely, a relatively thick native oxide film is formed on the nonpolar or semipolar surface of the semiconductor region 13 exposed to the atmosphere. The native oxide film is formed during transportation of the substrate product P1 from the processing device 10a to a film-forming device. As shown in Part (c) of FIG. 2, an oxidized product 15 of the native oxide film exists on the surface of the first substrate product P1.

If needed, a step to perform a pretreatment of the first substrate product P1 may be optionally provided as step S104. It is preferable to use, for example, at least one of aqua regia, hydrofluoric acid, and hydrochloric acid as a solution for the pretreatment. The pretreatment using these solutions can remove the oxidized product 15 formed on the surface 13a of the semiconductor region 13, to some extent.

Thereafter, step S105 is carried out to place the first substrate product P1 in the film-forming device 10b, as shown in Part (a) of FIG. 3.

If needed, a mask for a lift-off procedure can be formed on the first substrate product P1, prior to the placement thereof in the film-forming device 10b. This mask includes a resist layer. Immediately after the substrate product P1 is placed in the film-forming device 10b, the film-forming device 10b is vacuumized down to the vacuum degree of about $1 \times 10^{-6}$ Torr. It is noted that 1 Pa is equivalent to 0.0075 Torr. As shown in Part (b) of FIG. 3, step S106 is to deposit a film of metal electrode 17 on the surface of the first substrate product P1, using the film-forming device 10b. The metal electrode 17 can be formed, for example, by electron beam evaporation or by resistive heating. The temperature of the substrate 11 at this time is preferably, for example, not less than 15 degrees and not more than 100 degrees. The metal electrode 17 contains Pd. In an example, the metal electrode 17 is comprised of a Pd layer. The thickness of the Pd layer is preferably, for example, more than or equal to 10 nm.

When the metal electrode 17 is deposited, a transition layer 19 is made at an interface between the metal electrode 17 and the surface 13a of the semiconductor region 13. The transition layer 19 is a layer resulting from interdiffusion of Pd and GaN. The transition layer 19 is made at the same time as the deposition of the metal electrode 17. In the present embodiment, since the surface 13a of the semiconductor region 13 is nonpolar or semipolar, it is likely to bind to metal, different from the c-plane, and thus such transition layer 19 spreads.

The formation of the metal electrode 17 results in forming an ohmic electrode in electric contact with the surface 13a of the semiconductor region 13. This step results in producing a second substrate product P2. The substrate product P2 includes the metal electrode 17 provided on the semiconductor region 13 of the substrate product P1, and the transition layer 19 made at the interface between the semiconductor region 13 and the metal electrode 17.

Step S107 is to take the second substrate product P2 out of the film-forming device 10b. If the mask for the lift-off procedure is formed on the first substrate product P1, a step to perform the lift-off procedure is carried out to form a patterned electrode. The lift-off procedure is carried out, for example, using acetone or the like.

After that, it is common practice to perform a thermal treatment at about 400° C. with the second substrate product P2 being placed in a thermal treatment device. However, the present embodiment does not involve such a thermal treatment to complete the formation of the ohmic electrode. Then the second substrate product P2 is cut in a chip form. This completes the Group III nitride semiconductor device.

The below will describe the advantageous effects achieved by the Group III nitride semiconductor device and its fabrication method of the present embodiment described above.

The inventors attempted to form an electrode on a nonpolar or semipolar plane of GaN, using the conventional technology (Patent Literatures 1 and 2) for forming the ohmic electrode on the c-plane of GaN crystal. However, for example, when Ni/Au metal film was formed on a nonpolar or semipolar plane of GaN, e.g., a (11-22) plane and the metal film was alloyed in an oxygen atmosphere, the contact resistance of the ohmic electrode was not reduced. When a Pt electrode was made on a nonpolar or semipolar plane at high temperature as in the other conventional technology (Patent Literatures 3 and 4), no ohmic contact was achieved. Namely, it became clear that these conventional technologies allowed a good ohmic electrode to be formed on the c-plane of GaN crystal, but hardly allowed a good ohmic electrode to be formed on a nonpolar plane or a semipolar plane.

Then, the inventors produced a Pd electrode on a nonpolar plane and a semipolar plane of GaN crystal at low temperature. As a result, a goad ohmic contact was achieved. For finding the reason for it, a surface analysis was conducted with an X-ray photoelectron spectrometer (XPS). It was confirmed by this analysis that the Pd electrode formed at low temperature on the nonpolar or semipolar plane of GaN crystal provided a sub-peak which was not observed with the other electrodes. It is considered that a transition layer resulting from interdiffusion of Pd and GaN was newly made between the nonpolar or semipolar plane of GaN crystal and the Pd electrode and it improved the contact resistance between the GaN crystal and the Pd electrode. A bonding state of a crystal surface on the nonpolar or semipolar plane is different from that on the c-plane. GaN and Pd are likely to bind to each other on the nonpolar or semipolar plane. It is thus presumed that the transition layer as described above spread at the interface between the GaN crystal and the Pd electrode. This phenomenon is considered to occur in the same manner in the Group III nitride semiconductors other than GaN.

In this embodiment, as described above, the semiconductor region 13 has the surface 13a, which is nonpolar or semipolar. As the metal electrode 17 containing Pd is formed on the surface 13a, the transition layer 19 is made. The transition layer 19 improves adhesion between the semiconductor region 13 and the metal electrode 17, so as to decrease the contact resistance between them.

The thickness of the transition layer 19 is preferably more than or equal to 0.5 nm and less than or equal to 3 nm. The inventors investigated a relation between the thickness of the transition layer 19 and electrical characteristics. As a result, good electrical characteristics were obtained in the thickness range of more than or equal to 0.5 nm and less than or equal to 3 nm. Namely, the contact resistance can be more effectively reduced by the transition layer 19 in such thickness.

The metal electrode 17 preferably contains Pd. The reason for it is that the transition layer 19 is suitably made between the metal electrode 17 and the semiconductor region 13 when the metal electrode 17 contains Pd. It is, however, noted that the metal to form the transition layer 19 is not limited only to Pd. For example, the transition layer can be made by the metal electrode containing Pt.

The metal electrode 17 is preferably completed without being subjected to a thermal treatment, after the metal film is formed on the surface 13a of the semiconductor region 13. This permits the transition layer 19 to be suitably made between the metal electrode 17 and the semiconductor region 13.

Example 1

Figure 4A:
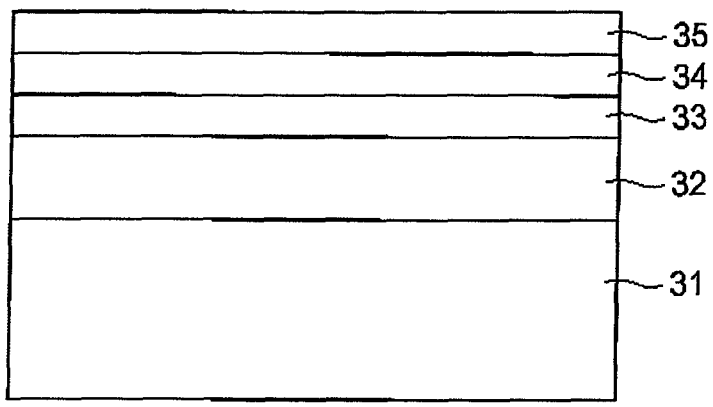
FIG. 4A is a drawing showing a configuration of an epitaxial substrate produced in Example 1.

An epitaxial substrate shown in FIG. 4A was produced by organometallic vapor phase epitaxy using an n-type semipolar GaN substrate 31. The primary surface of the GaN substrate 31 included an m-plane. An n-type GaN buffer layer 32 was formed on this primary surface. The epitaxial substrate Epi1 included a Si-doped n-type GaN layer 33, a Mg-doped GaN layer 34, and a high-concentration Mg-doped p-type GaN layer 35. The thickness of the Si-doped n-type GaN layer 33 was 1 μm. The thickness of the Mg-doped GaN layer 34 was 0.4 μm. The thickness of the high-concentration Mg-doped p-type GaN layer 35 was 50 nm. These GaN-based semiconductor layers were grown in order on the substrate 31.

Figure 4B:
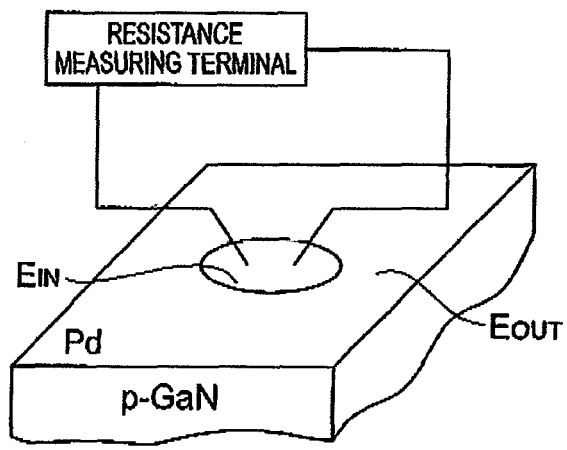
FIG. 4B is a drawing showing a palladium electrode structure including an inside electrode formed by photolithography, and an outside electrode isolated from the inside electrode.

A resist was then formed by photolithography, prior to deposition of a metal film for a p-type electrode. This resist had an annular aperture. Thereafter, a Pd electrode was evaporated onto the epitaxial substrate by the electron beam method, in an evaporation system in vacuum of about $1 \times 10^{-6}$ Torr. The thickness of the Pd electrode was 500 Å. The resist was lifted off using acetone. In this manner, a Pd electrode structure was produced as shown in FIG. 4B. This Pd electrode structure included an inside electrode $E_{IN}$ formed by photolithography, and an outside electrode $E_{OUT}$ isolated therefrom. The electrode structure with these electrodes was completed without being subjected to a thermal treatment.

Figure 5:
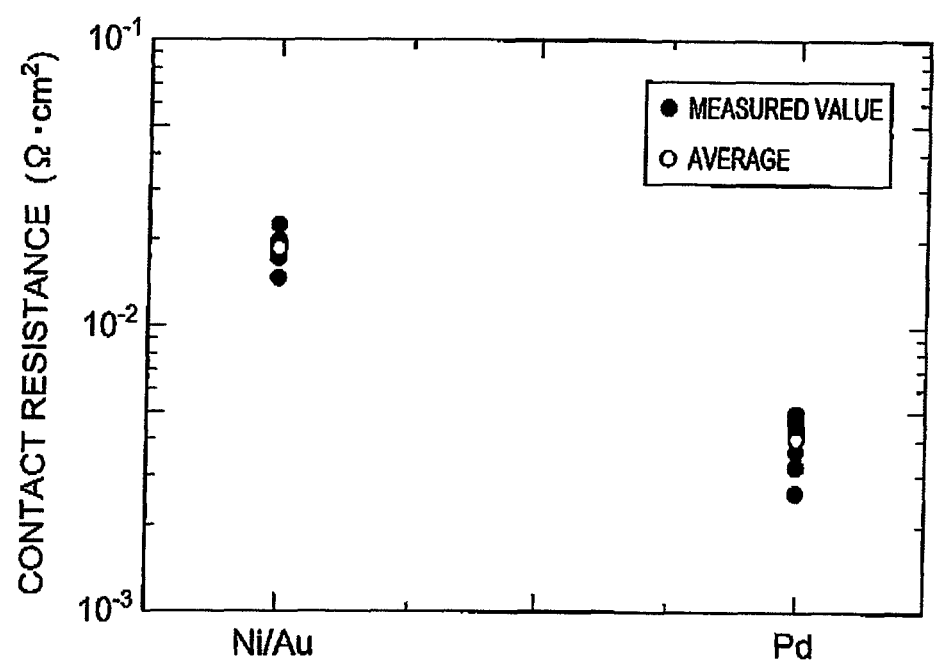
FIG. 5 is a graph showing the results of measurements of contact resistances.

The contact resistance of the electrode was measured using this electrode structure. FIG. 5 is a graph showing the result of the measurement of contact resistance. FIG. 5 also shows the measurement result of contact resistance of a Ni/Au electrode structure produced by the same method as above. As shown in FIG. 5, the contact resistance is effectively reduced by the Pd electrode structure of the present example, when compared to the Ni/Au electrode structure.

Example 2

An epitaxial substrate was produced according to the same procedure as in Example 1. This epitaxial substrate was subjected to ultrasonic organic cleaning using acetone and 2-propanol. Thereafter, it was cleaned with hydrochloric acid, aqua regia, and hydrofluoric acid, for five minutes each. A Pd electrode was evaporated onto this epitaxial substrate by the electron beam method. The thickness of the Pd electrode was 100 Å. The temperature during the evaporation was room temperature. On the other hand, another epitaxial substrate was prepared by the production and cleaning methods of the same steps as the above epitaxial substrate. An Ni/Au electrode was evaporated onto this epitaxial substrate. Then this Ni/Au electrode was subjected to a thermal treatment. Ni was evaporated by the electron beam method. Au was evaporated by resistive heating. The thickness of each of Ni and Au layers was 50 Å. In this manner, the different types of p-type electrodes were made on the two respective epitaxial substrates. An analysis was conducted to analyze the interface between the GaN crystal and the p-type electrode in these epitaxial substrates. This analysis was carried out with the X-ray photoelectron spectrometer.

FIGS. 6 and 7 are graphs showing the results of the analysis of these epitaxial substrates, Part (a) and (b) of FIG. 6 show Ga 2p spectra. Part (a) and (b) of FIG. 7 show N is spectra. In FIGS. 6 and 7, graphs G1 and G2 indicate spectra of the epitaxial substrate with the Pd electrode formed thereon. In FIGS. 6 and 7, graphs G3 and G4 indicate spectra of the epitaxial substrate with the Ni/Au electrode formed thereon. As shown in Part (a) and (b) of FIG. 6, a sub-peak exists on the higher energy side of the Ga 2p spectra of the epitaxial substrate with the Pd electrode thereon. However, no such peak exists in the Ga 2p spectra of the epitaxial substrate with the Ni/Au electrode thereon. This confirms that a new layer except for the GaN crystal, i.e., the transition layer is made in the epitaxial substrate with the Pd electrode thereon.

Figure 8:
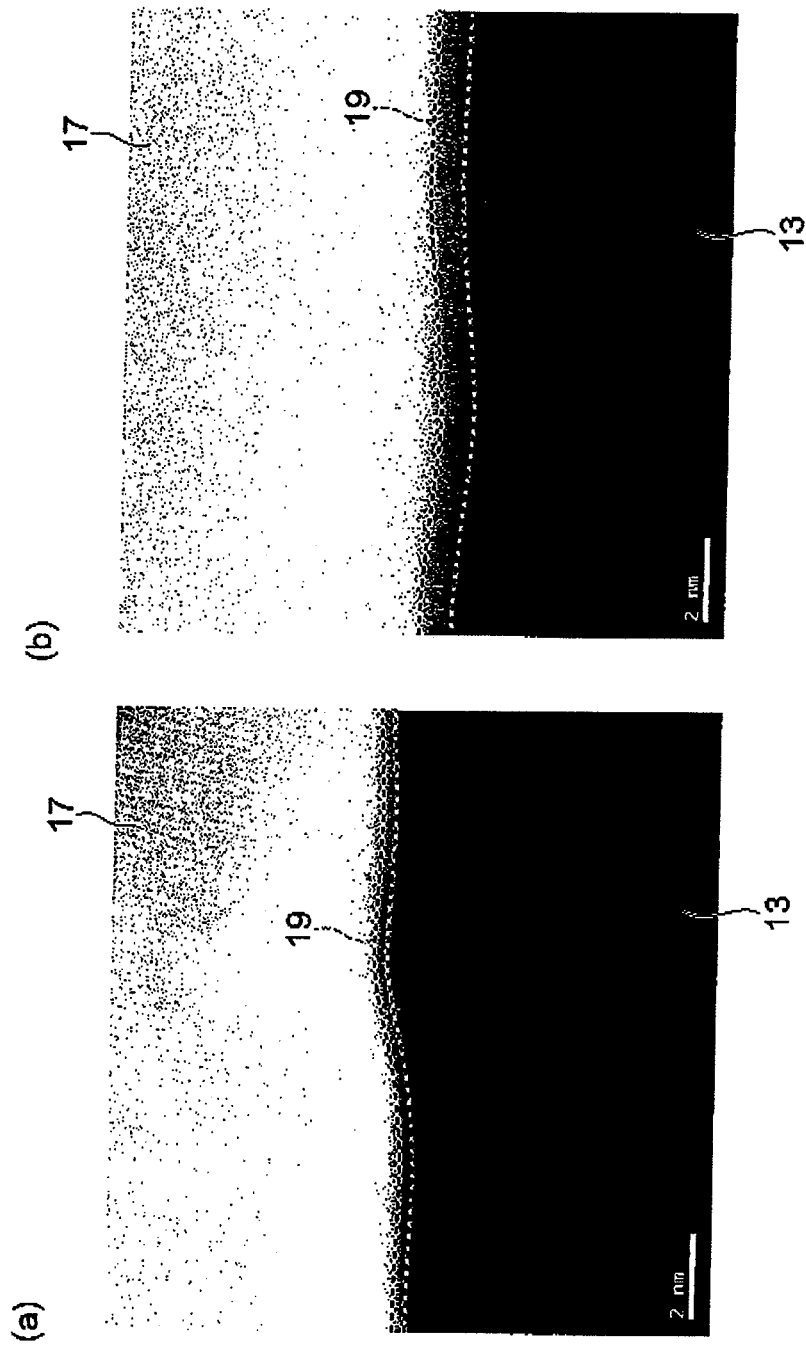
FIG. 8 is a photograph of cross sections of the epitaxial substrates produced in Example 2. The photograph is taken with a transmission electron microscope.

FIGS. 8 and 9 are transmission electron microscope photographs of cross sections of these epitaxial substrates. Part (a) of FIG. 8 shows the cross section of the epitaxial substrate on which the Pd electrode is formed and which was not subjected to a thermal treatment. Part (b) of FIG. 8 shows the cross section of the epitaxial substrate on which the Pd electrode is formed and which was subjected to the thermal treatment. The temperature of the thermal treatment is 310° C. and the treating time is one minute. Part (a) and (b) of FIG. 9 show the cross sections of the epitaxial substrate with the Au/Ni electrode thereon.

As shown in Part (a) and (b) of FIG. 8, it is confirmed that a thin new layer, or the transition layer 19 is formed between the Pd electrode and the GaN layer in the epitaxial substrate with the Pd electrode thereon. However, as shown in Part (a) and (b) of FIG. 9, no such layer is recognized in the epitaxial substrate with the Ni/Au electrode thereon. In Part (a) of FIG. 8, the thickness of the transition layer 19 is 0.5 nm. In contrast to it, the thickness of the transition layer 19 is increased to 2.0 nm in Part (b) of FIG. 8. It is seen from this result that the transition layer spreads in the depth direction when the epitaxial substrate with the Pd electrode thereon is subjected to the thermal treatment. The contact resistance is slightly reduced between the Pd electrode and the GaN layer.

FIGS. 10 and 11 are graphs showing differences of spectra depending upon the presence/absence of a surface treatment, in the epitaxial substrate with the Pd electrode thereon. Part (a) and (b) of FIG. 10 show Ga 2$p$ spectra. Part (a) and (b) of FIG. 11 show N 1$s$ spectra. In FIGS. 10 and 11, graphs G11 and G12 indicate spectra of the epitaxial substrate not subjected to the surface treatment. In FIGS. 10 and 11, graphs G13 to G16 indicate spectra of the epitaxial substrate subjected to the surface treatment.

As shown in FIGS. 10 and 11, the height of a sub-peak of the epitaxial substrate subjected to the surface treatment is slightly higher than the height of a sub-peak of the epitaxial substrate not subjected to the surface treatment. However, there is little difference in band bending between these epitaxial substrates. Namely, the transition layer is suitably formed regardless of the presence/absence of the surface treatment, in the epitaxial substrate with the Pd electrode thereon.

The Group III nitride semiconductor device of the present embodiment is a semiconductor optical device, e.g., such as a semiconductor laser or a light emitting diode. The Group III nitride semiconductor device of the present embodiment is a semiconductor device having the nonpolar or semipolar surface of the Group III nitride semiconductor doped with the p-type dopant, and the electrode formed on the nonpolar surface.

The principle of the present invention was illustrated and explained in the preferred embodiments, but it is recognized by those skilled in the art that the present invention can be modified in arrangement and detail without departing from the principle. The present invention is by no means limited to the specific configurations disclosed in the embodiments. Therefore, the applicant claims all modifications and changes falling within the scope of claims and resulting from the scope of spirit thereof.

What is claimed is:

1. A Group III nitride semiconductor device comprising:
   a semiconductor region having a surface comprised of a Group III nitride crystal, the semiconductor region being doped with a p-type dopant, the surface being either a semipolar surface or a nonpolar surface;
   a metal electrode provided on the surface; and
   a transition layer formed between the Group III nitride crystal of the semiconductor region and the metal electrode, the transition layer being made by interdiffusion of a metal of the metal electrode and a Group III nitride of the semiconductor region,
   wherein the metal electrode is formed without a thermal treatment process after forming a metal film on the surface so as to provide an ohmic contact between either the semipolar surface or the nonpolar surface and the metal electrode, wherein
   a thickness of the transition layer is more than or equal to 0.5 nm and less than or equal to 3 nm, and
   wherein an angle between a normal to the surface and a c-axis of the Group III nitride crystal constituting the semiconductor region is in the range of 63 degrees to 80 degrees or in the range of 100 degrees to 117 degrees.

2. The Group III nitride semiconductor device according to claim 1, wherein the metal electrode contains at least one of palladium and platinum.

3. A Group III nitride semiconductor device comprising:
   a semiconductor region having a surface comprised of a Group III nitride crystal, the semiconductor region being doped with a p-type dopant, the surface being either a semipolar surface or a nonpolar surface;
   a metal electrode provided on the surface; and
   a transition layer formed between the Group III nitride crystal of the semiconductor region and the metal electrode, the transition layer being made by interdiffusion of a metal of the metal electrode and a Group III nitride of the semiconductor region,
   wherein the metal electrode contains at least one of palladium and platinum,
   wherein the metal electrode is formed without a thermal treatment process after forming a metal film on the surface so as to provide an ohmic contact between either the semipolar surface or the nonpolar surface and the metal electrode, and
   wherein an angle between a normal to the surface and a c-axis of the Group III nitride crystal constituting the semiconductor region is in the range of 63 degrees to 80 degrees or in the range of 100 degrees to 117 degrees.

* * * * *